United States Patent
Yoon et al.

(10) Patent No.: US 8,897,087 B2
(45) Date of Patent: Nov. 25, 2014

(54) MEMORY DEVICE AND OPERATING METHOD OF MEMORY DEVICE AND MEMORY SYSTEM

(71) Applicant: SK Hynix Inc., Gyeonggi-do (KR)

(72) Inventors: Hyun-Su Yoon, Gyeonggi-do (KR); Ki-Chang Kwean, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/031,814

(22) Filed: Sep. 19, 2013

(65) Prior Publication Data

US 2014/0301150 A1    Oct. 9, 2014

(30) Foreign Application Priority Data

Apr. 4, 2013    (KR) .................. 10-2013-0036707

(51) Int. Cl.
*G11C 29/00* (2006.01)
*G11C 7/00* (2006.01)

(52) U.S. Cl.
CPC ...................................... *G11C 7/00* (2013.01)
USPC .......................................... 365/200; 365/203

(58) Field of Classification Search
USPC ........................................................ 365/200
See application file for complete search history.

(56) References Cited

U.S. PATENT DOCUMENTS

| 6,667,902 | B2 | 12/2003 | Peng |
| 6,777,757 | B2 | 8/2004 | Peng et al. |
| 6,904,751 | B2 | 6/2005 | Makki et al. |
| 6,949,986 | B2 * | 9/2005 | Tsujino et al. ................ 365/200 |
| 7,173,851 | B1 | 2/2007 | Callahan et al. |
| 7,269,047 | B1 | 9/2007 | Fong et al. |
| 7,746,712 | B2 * | 6/2010 | Kang et al. ................... 365/200 |
| 2003/0202409 | A1 * | 10/2003 | Yamaoka et al. ............. 365/201 |

* cited by examiner

*Primary Examiner* — Son Mai
(74) *Attorney, Agent, or Firm* — IP & T Group LLP

(57) ABSTRACT

An operating method of a memory device includes entering a repair mode, receiving an active command and a fail address, and temporarily storing the received command and address, receiving a write command, and determining whether to perform a program operation, when the program operation is determined to be performed, programming the temporarily-stored fail address into a programmable storage unit, and receiving a precharge command before the programming of the temporarily-stored fail address is completed.

20 Claims, 7 Drawing Sheets

MEMORY DEVICE AND OPERATING METHOD OF MEMORY DEVICE AND MEMORY SYSTEM

CROSS-REFERENCE TO RELATED APPLICATIONS

The present application claims priority of Korean Patent Application No. 10-2013-0036707, filed on Apr. 4, 2013, which is incorporated herein by reference in its entirety.

BACKGROUND

1. Field

Exemplary embodiments of the present invention relate to a semiconductor device design technology, and more particularly, to a technology related to a repair operation for a memory device.

2. Description of the Related Art

FIG. 1 is a block diagram for explaining a repair operation in a conventional memory device, for example, DRAM.

FIG. 1 illustrates a configuration corresponding to one memory bank inside the memory device. Referring to FIG. 1, the memory device includes a memory cell array 110, a row circuit 120, and a column circuit 130. The memory cell array 110 includes a plurality of memory cells. The row circuit 120 is configured to enable a row (or a word line) selected by a row address R_ADD when a row active signal RACT, activated in response to an active command to enable a word line within the memory cell array 110 and deactivated in response to a precharge command to disable a word line, is activated. The column circuit 130 is configured to access, for example, read or write, data of a column (or a bit line) selected by a column address C-ADD when an internal read command RD or an internal write command WR is activated.

A row fuse circuit 140 is configured to store a row address corresponding to a defective memory cell within the memory cell array 110 as a repair row address REPAIR_R_ADD. A row comparator 150 is configured to compare the repair row address REPAIR_R_ADD stored in the row fuse circuit 140 to a row address R_ADD inputted from outside the memory device. When the repair row address REPAIR_R_ADD coincides with the row address R_ADD, the row comparator 150 controls the row circuit 120 to enable a redundancy word line instead of a word line designated by the row address R_ADD. That is, a row corresponding to the repair row address REPAIR_R_ADD stored in the row fuse circuit 140 is replaced with a redundancy row within the memory cell array 110.

Here, DQs denotes data or data pads.

Conventionally, laser fuses are mainly used as the fuse circuit 140. The laser fuses stores logic high or logic low data depending on whether the fuse is cut or not. The laser fuses may be programmed in a wafer state, and may not be programmed after a wafer is mounted in a package. Furthermore, the laser fuses may not be designed with a small circuit area because of the limit in a line pitch.

In order to overcome such concerns, a programmable storage unit including an E-fuse array circuit, a NAND flash memory, a NOR flash memory, a magnetic random access memory (MRAM), a spin transfer torque magnetic random access memory (STT-MRAM), a resistive random access memory (ReRAM), or a phase change random access memory (PCRAM) as disclosed in U.S. Pat. Nos. 6,904,751, 6,777,757, 6,667,902, 7,173,851, and 7,269,047, is disposed into the memory device, and repair information, for example, fail address, is stored in the programmable storage unit.

FIG. 2 is a block diagram illustrating a memory device including a programmable storage unit for storing repair information.

Referring to FIG. 2, the memory device includes a plurality of memory banks BK0 to BK3, a plurality of registers 210_0 to 210_3 provided for the respective banks BK0 to BK3 to store repair information, and a programmable storage unit 201.

The programmable storage unit 201 replaces the fuse circuit 140 shown in FIG. 1. The programmable storage unit 201 stores the repair information corresponding to the banks BK0 to BK3, for example, fail addresses. The programmable storage unit 201 may include any one of an E-fuse array circuit, NAND flash memory, NOR flash memory, MRAM, STT-MRAM, ReRAM, and PCRAM.

The registers 210_0 to 210_3 provided for the respective banks BK0 to BK3 are configured to store the repair information of the corresponding memory banks. That is, the register 210_0 stores the repair information of the memory bank BK0, and the register 210_2 stores the repair information of the memory bank BK2. The registers 210_0 to 210_3 each may include latch circuits, and may store the repair information only while power is supplied. The repair information to be stored in the registers 210_0 to 210_3 may be received from the programmable storage unit 201.

The repair information stored in the programmable storage unit 201 is not directly used, but transferred and stored in the registers 220_0 to 210_3 and then used. Since the programmable storage unit 201 is configured in an array form, a predetermined time is required to call data stored in the programmable storage unit 201. Thus, the data stored in the programmable storage unit 201 may not be directly used to perform a repair operation, so that a boot-up operation is performed to transmit and store the repair information stored in the programmable storage unit 201 into the registers 210_0 to 210_3. After the boot-up operation, the data stored in the registers 210_0 to 210_3 are used to perform the repair operation.

When the fuse circuit 140 configured with a laser fuse is replaced with the programmable storage unit 201 and the registers 210_0 to 210_3, it may be possible to repair additional defects discovered after a wafer state, for example, in a package state.

SUMMARY

Various embodiments are directed to an effective technology that may repair a defect even after a memory device is packaged.

In an embodiment, an operating method of a memory device includes, entering a repair mode, receiving an active command and a fail address, and temporarily storing the received command and address, determining whether to perform a program operation, when the program operation is determined to be performed, programming the temporarily-stored fail address into a programmable storage unit, and receiving a precharge command before the programming of the temporarily-stored fail address is completed.

In an embodiment, a memory device includes a command input unit suitable for receiving a plurality of commands, an address input unit suitable for receiving a plurality of address bits, a data input unit suitable for receiving a plurality of data, a command decoder suitable for decoding the plurality of commands and generating an internal active command, an internal mode setting command, an internal write command, an internal precharge command, an internal refresh command, and an internal read command, a mode decoder suitable for generating a repair mode signal by using the internal mode setting command and the address bits as a mode setting code, a temporary storage unit suitable for temporarily storing the address bits as a fail address, when the internal active command and the repair mode signal are activated, a control unit suitable for determining whether to perform a program operation in response to activation of the internal write command and the repair mode signal, and a programmable storage unit suitable for being programmed with the temporarily-stored fail address, when the control unit determines to perform the program operation.

In an embodiment, an operating method of a memory system includes entering, by a memory device, a repair mode according to control of a memory controller, applying, by the memory controller, a fail address and an active command to the memory device, temporarily storing, by the memory device, the fail address, applying, by the memory controller, a write command to the memory device, determining whether to perform a program operation, in response to the application of the write command, programming, by the memory device, the temporarily-stored fail address into a programmable storage unit inside the memory device, when the program operation is determined to be performed, and applying, by the memory controller, a precharge command to the memory device before the programming of the temporarily-stored fail address is completed.

DETAILED DESCRIPTION

Figure 1:
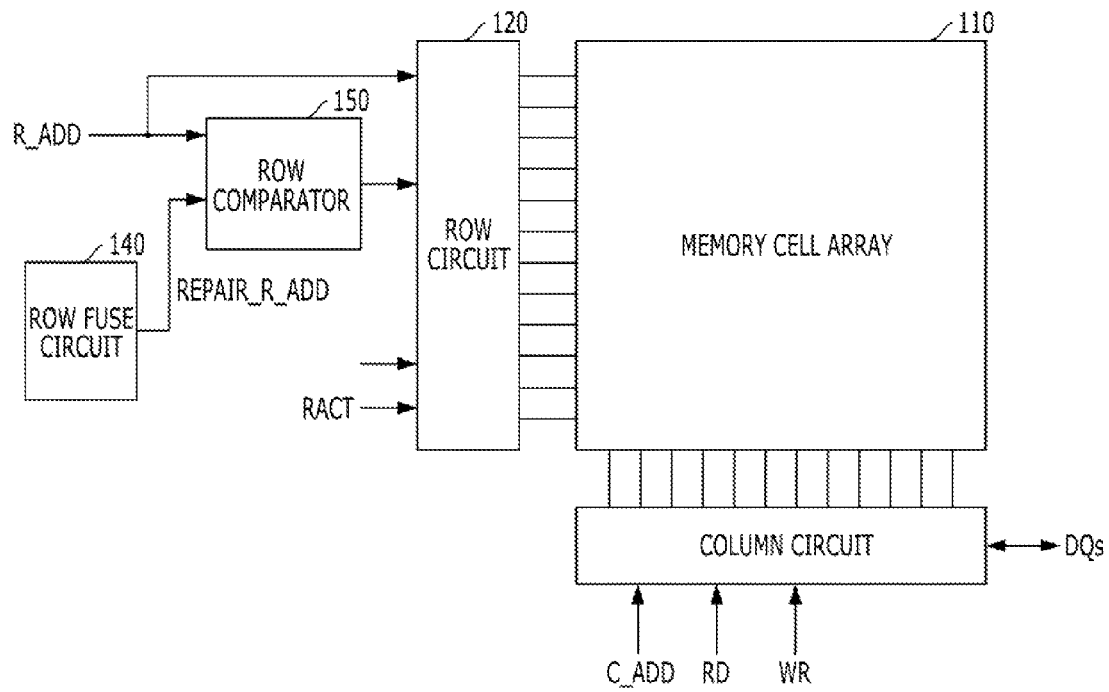
FIG. 1 is a block diagram for explaining a repair operation in a conventional memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 3:
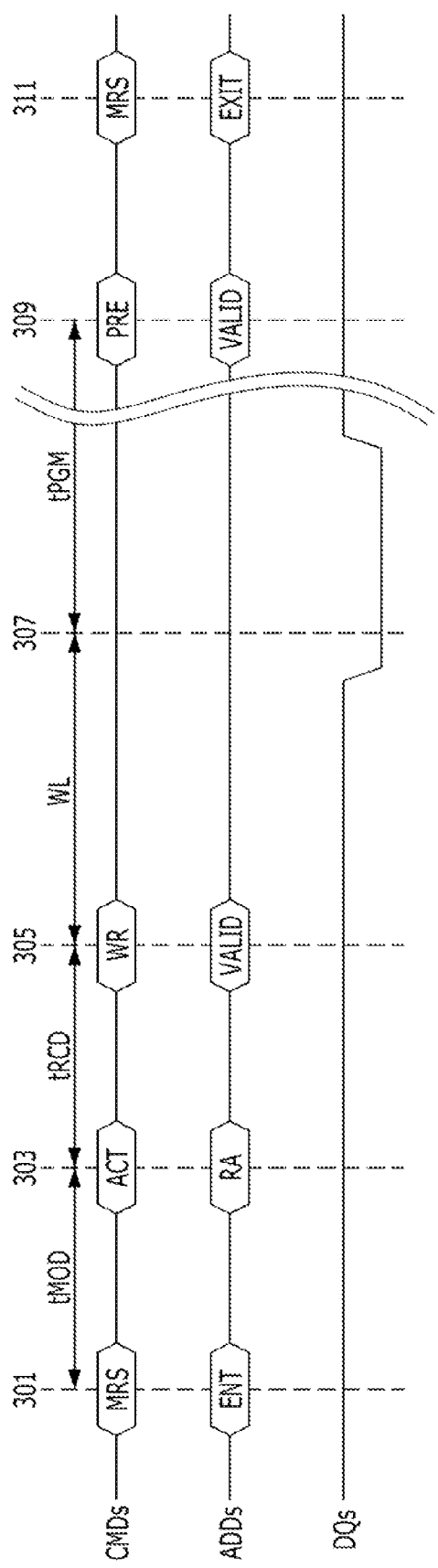
FIG. 3 is a timing diagram for explaining a post package repair process of a memory device in accordance with a comparative example of the present invention.

FIG. 3 is a timing diagram for explaining a post package repair process of a memory device in accordance with a comparative example of the present invention. The post package repair process indicates a repair process which is performed after the memory device is packaged.

Referring to FIG. 3, a mode setting command MRS and a mode setting code, for example, a certain combination of address bits, for entering a repair mode are inputted to the memory device at a time point 301. Since the combination of address bits corresponds to repair mode entry, the combination of address bits is represented by "ENT". For example, as the mode setting command MRS is applied, a mode resistor MR6 may be selected and an eighth address bit may be inputted as '1'. Then, the memory device enters the repair mode. In FIG. 3, "tMOD" represents a time period from the time at which the mode setting command MRS is inputted to the time at which a non-mode setting command may be inputted, and may be considered as a time required until the memory device enters the repair mode according to the mode setting command MRS and the combination of address bits inputted at the time point 301. For reference, before the memory device enters the repair mode, the memory device may maintain a state in which all memory banks are pre-charged.

After the memory device completely entered the repair mode, for example, after the time tMOD, an active command ACT and a fail address RA are inputted to the memory device at a time point 303. Then, the memory device temporarily stores the fail address RA. The fail address RA means an address indicating the position of a defective cell inside the memory device.

After RAS to CAS delay time (tRCD) passes from the time point at which the active command ACT is applied, a write command WR and a valid address VALID are inputted to the memory device at a time point 305. At this time, the memory device does not care the value of the valid address VALID inputted with the write command WR. In other word, the memory device does not care the valid address VALID. After a time corresponding to a write latency WL passes from the time point 305 at which the write command WR is applied, the memory device checks whether logic states of data pads DQs are '0' or not, at a time point 307. The write latency WL is equal to the sum of CWL (CAS write latency), AL (Additive Latency), and PL (Parity Latency). When the logic states of the data pads DQs are '0', it means that the memory device is a target, and when the logic states of the data pads DQs are '1', it means that the memory device is not a target. The target indicates a memory device to perform a repair operation among memory devices inside the system.

Figure 2:
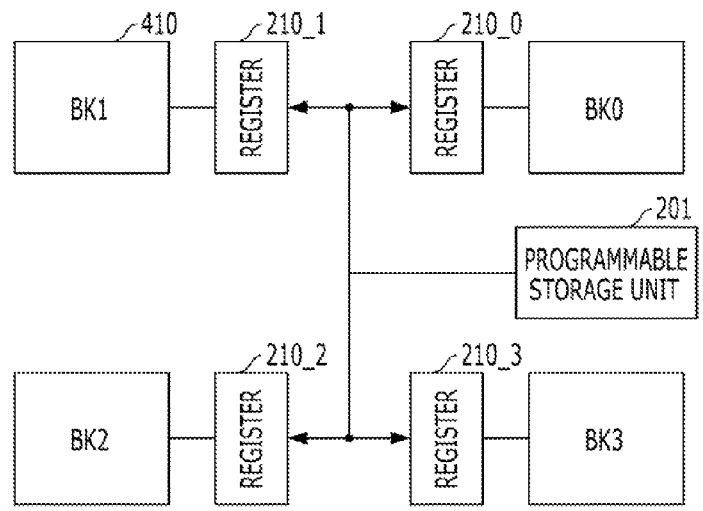
FIG. 2 is a block diagram illustrating a memory device including a programmable storage unit for storing repair information.

When it is checked at the time point 307 that the memory device is a target, the memory device programs the fail address RA, which is inputted with the active command ACT and temporarily stored, into a programmable storage unit. At this time, the programmable storage unit indicates a programmable storage unit to store a fail address for repair, like the programmable storage unit 201 shown in FIG. 2.

After the fail address RA is programmed into the programmable storage unit device, that is, after program operation time tPGM passes, a precharge command PRE is inputted to release the active state of the memory device at a time point 309. Then, a mode setting command MRS and a mode setting code, for example, a certain combination of address bits, for repair mode exit are inputted to the memory device at a time point 311. Since the combination of address bits corresponds to the repair mode exit, the combination of address bits is represented by "EXIT". For example, as the mode setting command MRS is applied, the mode register MR6 may be selected, and the eighth address bit may be inputted as '0'. Thus, the repair mode of the memory device is ended, and a normal operation is started.

The post package repair process of FIG. 3 may be briefly summarized as follows: (1) the memory device enters the repair mode, (2) the active command ACT and the fail address RA are applied, (3) the write command WR is applied, (4) the memory device checks the data pads DQs after WL passes from the application of the write command WR, and determines whether or not the memory device is a target, (5) when the memory device is a target, the memory device programs the fail address RA applied with the active ACT into the programmable storage unit, (6) the precharge command PRE is applied after the program operation is completed, and (7) the memory device exits from the repair mode. In this case, the program operation time tPGM required for programming the fail address into the programmable storage unit is considerably long. Since the program operation of the programmable storage unit is performed before the precharge operation after the memory device is activated, the memory device may not be refreshed during the program operation time tPGM. That is because the refresh operation may be performed only in a precharge state. Therefore, data which is stored in the memory device before the post package repair process are likely to be lost because a refresh operation is not performed.

Figure 4:
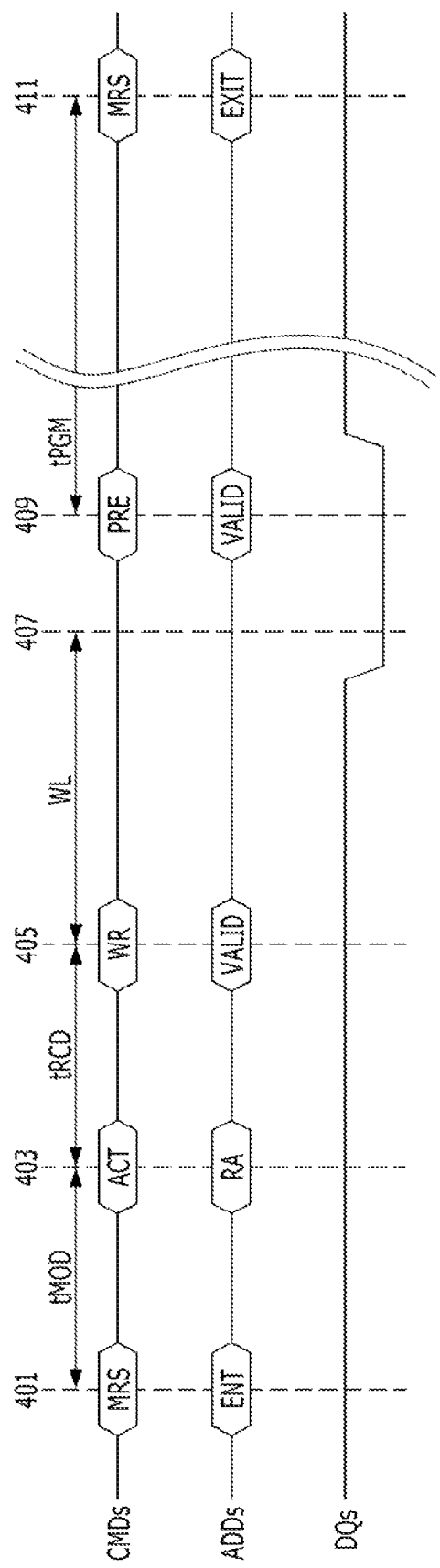
FIG. 4 is a timing diagram for explaining a post package repair process of a memory device in accordance with an embodiment of the present invention.

FIG. 4 is a timing diagram for explaining a post package repair process of a memory device in accordance with an embodiment of the present invention.

Referring to FIG. 4, a mode setting command MRS and a combination of address bits for entering a repair mode are inputted to the memory device at a time point '401'. For example, as the mode setting command MRS is applied, a mode register MR6 may be selected, and an eighth address may be inputted as '1'. Then, the memory device enters the repair mode. In FIG. 4, 'tMOD' represents a time interval from the time at which the mode setting command MRS is inputted to the time at which a non-MRS command may be inputted, and may be considered as a time required until the memory device enters the repair mode according to the mode setting command MRS and the combination of address bits which are inputted at the time point 401. For reference, before the memory device enters the repair mode, the memory device may maintain a state in which all memory banks are precharged.

After the memory device completely entered the repair mode, for example, after the time tMOD, an active command ACT and a fail address RA are inputted to the memory device at a time point 403. Then, the memory device temporarily stores the fail address. The fail address RA means an address indicating the position of a defective cell within the memory device.

After the RAS to CAS delay time tRCD passes from the time point at which the active command ACT is applied, a write command WR and a valid address VALID are inputted to the memory device at a time point 405. The memory device does not care the value of the valid command VALID inputted with the write command WR. In other words, the memory device does not care a valid address. After a time corresponding to a write latency WL passes from the time point 405 at which the write command WR is applied, the memory device checks whether logic states of the data pads DQs are 0 or not, at a time point 407. When the logic states of the data pads DQs are '0', it means that the memory device is a target, and when the logic states of the data pads DQs are '1', it means that the memory device is not a target. The target indicates a memory device to perform a repair operation, among memory devices within the system.

When it is checked at the time point 407 that the memory device is a target, the memory device programs the fail address RA, which is inputted with the active command ACT and temporarily stored, into the programmable storage unit in response to a precharge command PRE applied at a time point 409. In FIG. 4, "tPGM" represents a time required while the fail address is programmed into the programmable storage unit inside the memory device. After the precharge command PRE is applied, a refresh command REF may be inputted to the memory device even though the program operation is not completed, for example, even before the program operation time tPGM is ended. Therefore, it may be possible to prevent data stored in the memory device from being lost during the long program operation time tPGM.

After the program operation is completed, a mode setting command MRS and a combination of address bits for repair mode exit are inputted to the memory device at a time point 411. For example, as the mode setting command MRS is applied, the mode register MR6 may be selected, and the eighth address may be inputted as '0'. Thus, the repair mode of the memory device is ended, and a normal operation is started.

The post package repair process of FIG. 4 may be briefly summarized as follows: (1) the memory device enters the repair mode, (2) the active command ACT and the fail address RA are applied, (3) the write command WR is applied, (4) the memory device checks the data pads DQs after WL passes from the application of the write command WR, and determines whether or not the memory device is a target, (5) the precharge command PRE is applied, (6) when the memory device is a target, the memory device programs the fail address RA applied with the active ACT into the programmable storage unit in response to the precharge command PRE, and (7) the memory device exits from the repair mode. In the embodiment of FIG. 4, since the program operation is performed after the application of the precharge command PRE, the memory device is in a precharge state during the program operation of the programmable storage unit. Thus, even during the program operation tPGM, a refresh command REF may be applied to refresh the memory device. In the comparative example of FIG. 3, the refresh operation may not be performed during the program operation. However, the embodiment of the present invention has an advantage in terms of data retention characteristics.

Figure 5:
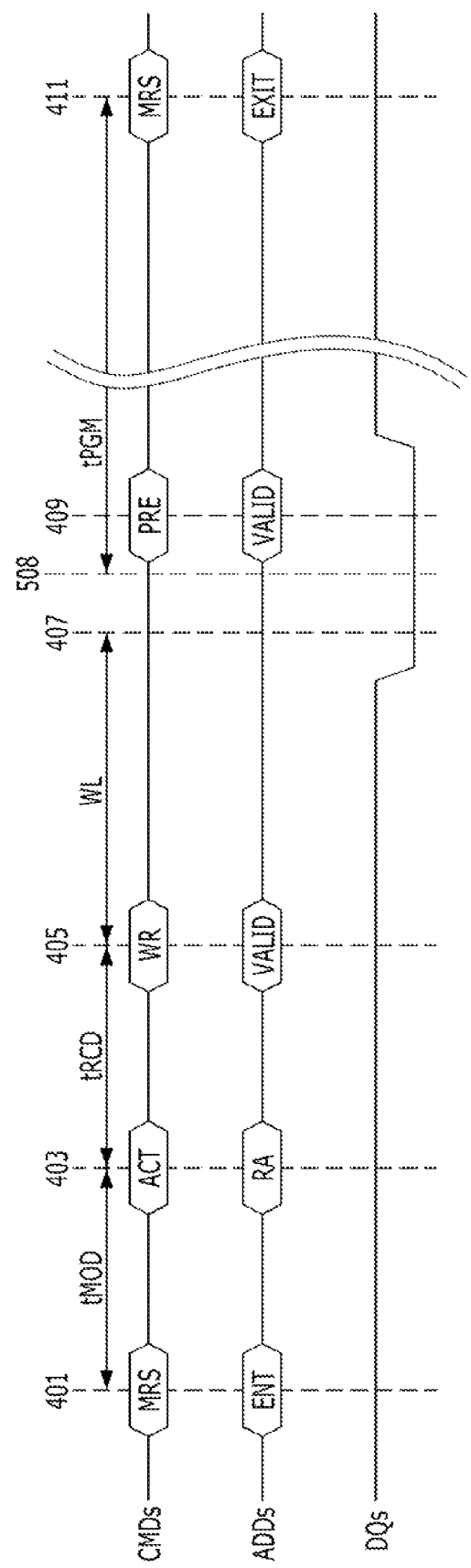
FIG. 5 is a timing diagram for explaining a post package repair process of a memory device in accordance with another embodiment of the present invention.

FIG. 5 is a timing diagram for explaining a post package repair process of a memory device in accordance with another embodiment of the present invention. Since the process of FIG. 5 is almost similar to the process of FIG. 4, the following descriptions will be focused on a difference therebetween.

Referring to FIG. 5, when it is checked at the time point 407 that the memory device is a target, the memory device starts a program operation to program a fail address RA inputted with an active command into a programmable storage unit, regardless of application of a precharge command PRE. In the embodiment of FIG. 5, the start of the program operation does not depend on the precharge command PRE, unlike the embodiment of FIG. 4. The program operation may be started at a time point 508 before the time point 409 at which the precharge command PRE is applied.

Furthermore, before the program operation is completed, that is, during the program operation time tPGM, the precharge command PRE is applied to the memory device, and a refresh operation for the memory device may be performed after the time point 409 at which the precharge command PRE is applied. In accordance with the embodiment of FIG. 5, although the program operation of the programmable storage unit is started even before the application of the precharge command PRE, the precharge command PRE may be applied during the program operation of the programmable storage unit, and the memory device may be refreshed after the application of the precharge command PRE. Therefore, it may be possible to prevent data stored in the memory device from being lost.

Figure 6:
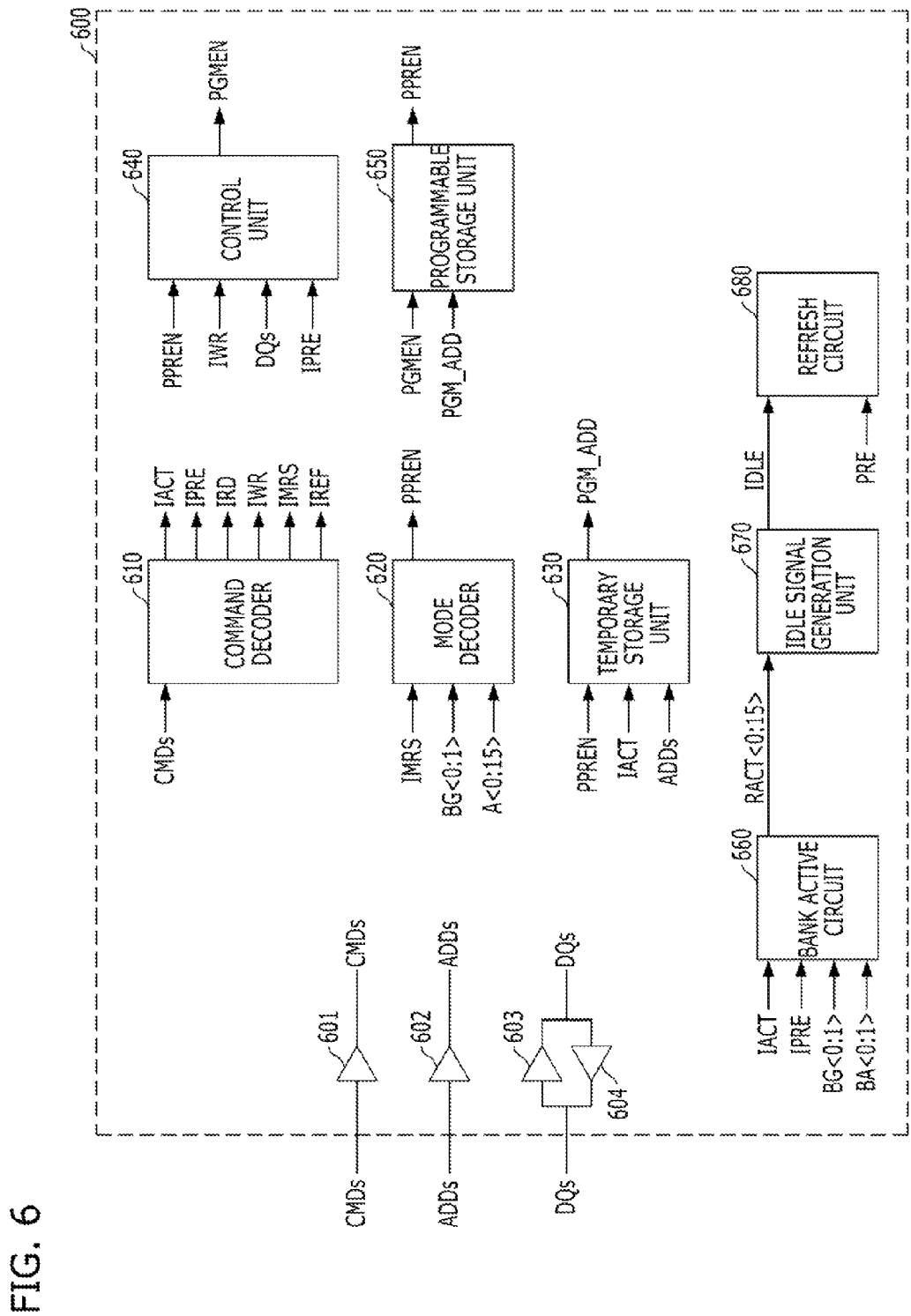
FIG. 6 is a block diagram of a memory device in accordance with the embodiments of the present invention.

FIG. 6 is a block diagram of a memory device 600 in accordance with the embodiments of the present invention, as illustrated in FIG. 4 or 5. The memory device 600 may include DRAM.

Referring to FIG. 6, the memory device 600 may include a command input unit 601, an address input unit 602, a data input unit 603, a data output unit 604, a command decoder 610, a mode decoder 620, a temporary storage unit 630, a control unit 640, a programmable storage unit 650, a bank active circuit 660, an idle signal generation unit 670, and a refresh circuit 680.

The command input unit 601 receives command signals from outside the memory device 600. The command signals CMDs may include a chip select signal CS, an active signal ACT, a row address strobe signal RAS, a column address strobe signal CAS, and a write enable signal WE.

The address input unit 602 is configured to receive addresses ADDs composed of multiple bits from outside the memory device 600. The addresses ADDs may include a normal address A<0:15> indicating a row address and a column address and represented as 16 bits, a bank group address BG<0:1> represented as two bits, a bank address BA<0:1> represented as two bits. Since the bank group address BG<0:1> and the bank address BA<0:1> are used for addressing a large unit such as a bank group or bank, the bank group address BG<0:1> and the bank address BA<0:1> may be referred to as a higher address. Since the normal address A<0:15> is used for addressing in a bank, the normal address A<0:15> may be referred to as a lower address. A row address and a column address are inputted through the same pad, and an address inputted in synchronization with the row address strobe signal RAS is recognized as a row address by the memory device 600, and an address inputted in synchronization with the column address strobe signal CAS is recognized as a column address by the memory device 600. In FIG. 6, it may considered that ADDs represents BG<0:1>, BA<0:1>, and A<0:15>.

The data input unit 603 is configured to receive multi-bit data from outside the memory device 600. The data output unit 604 is configured to output data to the outside of the memory device 600. For example, data to be written into the memory device are inputted through the data input unit 603, and data read from the memory device are outputted through the data output unit 604.

The command decoder 610 is configured to generate various internal commands by decoding commands CMDs inputted through the command input unit 601. The internal commands may include an internal active command IACT, an internal precharge command IPRE, an internal read command IRD, an internal write command IWR, an internal mode setting command IMRS, an internal refresh command IREF, and the like.

The mode decoder 620 is configured to generate a repair mode signal PPREN by decoding a part of the addresses ADDs, for example, BG<0:1> and A<0:15>, when the internal mode setting command IMRS is activated by the command decoder 610. In this embodiment in accordance with the present invention, the mode decoder 620 decodes the addresses BG<0:1> and A<0:15>. However, the types and bit numbers of addresses decoded by the mode decoder 620 may be changed. When the repair mode signal PPREN is activated, it indicates that the repair mode is set, and when the repair mode signal PPREN is deactivated, it indicates that the repair mode is not set. The mode decoder 620 may generate signals related to various operation modes and mode settings of the memory device 600 in addition to the repair mode signal PPREN. However, since the signals have no direct connection to the present invention, the descriptions thereof are omitted herein.

The temporary storage unit 630 is configured to temporarily store the addresses ADDs inputted through the address input unit 602 when the internal active command IACT is activated in a state where the repair mode signal PPREN is activated. The temporary storage unit 630 may temporarily store all of the addresses ADDs or may temporarily store a part of the addresses ADDs. That is because, although an address is stored in the programmable storage unit 650 in a state where a part of the address is omitted, a defect may be repaired depending on repair schemes. For example, when a repair scheme is designed in such a manner that an independent row for each bank may not be repaired and the same rows are repaired in all banks, addresses for distinguishing the banks may not be required.

The control unit 640 is configured to check logic states of the data DQs inputted to the data input unit 603 after a time corresponding to a write latency WL passes from a time point at which the internal write command IWR is activated in a state where the repair mode signal PPREN is activated. When the logic states of the data DQs are '0', the control unit 640 determines to perform a program operation. Otherwise, the control unit 640 determines to not perform a program operation. When the control unit 640 determines to perform a program operation, the control unit 640 may activate a program signal PGMEN in response to the activation of the internal precharge command IPRE, for example, in the program operation shown in FIG. 4, or immediately activate the program signal PGMEN regardless of the activation of the internal precharge command IPRE, for example, in the program operation shown in FIG. 5. When the control unit 640 operates as illustrated in FIG. 5, the internal precharge command IPRE does not need to be inputted to the control unit 640.

The programmable storage unit 650 is configured to program the address PGM_ADD stored in the temporary storage unit 630 thereto, when the program signal PGMEN is activated. The address programmed in the programmable storage unit 650 is transmitted to registers (not illustrated) provided in memory banks (not illustrated) during a boot-up operation, and used to repair a defective cell inside the memory banks. The programmable storage unit 650 may include one of an E-fuse array circuit, a NAND flash memory, a NOR flash memory, a MRAM, a STT-MRAM, a ReRAM, and a PCRAM.

The bank active circuit 660 is configured to receive the bank group address BG<0:1> and the bank address BA<0:1> among the addresses ADDs inputted through the address input unit 602, and receive the internal active command IACT and the internal precharge command IPRE. The bank active circuit 660 generates bank active signals RACT<0:15> corresponding to the respective memory banks. The bank active circuit 660 selects one of 16 memory banks, for example, BK0 to BK15, using a bank information, for example, the bank group address BG<0:1> and the bank address BA<0:1>.

Furthermore, when the internal active command IACT is activated, the back active circuit 660 activates a bank active signal corresponding to the selected memory bank, and when the internal precharge command IPRE is activated, the back active circuit 660 deactivates the bank active signal corresponding to the selected memory bank. For example, when the internal active command IACT is activated in a state where a third bank BK3 is selected in response to the addresses BG<0:1> and BA<0:1>, a bank active signal RACT<3> is activated, and when the internal precharge command IPRE is activated, the activated bank active signal RACT<3> is deactivated. The bank active signals RACT<0: 15> are signals for controlling the corresponding memory banks BK0 to BK15 to an active state. For example, while the bank active signal RACT<3> is activated, the memory bank BK3 is activated, and when the bank active signal RACT<3> is deactivated, the memory bank BK3 is precharged.

The idle signal generation unit 670 is configured to receive the bank active signal RACT<0:15> and generate an idle signal IDLE. The idle signal IDLE indicates that the memory device 600 is in an idle state. When all of the memory banks BK0 to BK15 inside the memory device 600 are precharged, it corresponds to the idle state of the memory device 600. Thus, when all of the bank active signals RACT<0:15> are deactivated, the idle signal generation unit 670 activates the idle signal IDLE.

The refresh circuit 680 is configured to control the banks BK0 to BK15 inside the memory device 600 to be refreshed according to a predetermined sequence, when the internal refresh command IREF is activated in a state where the idle signal IDLE is activated. When the internal refresh command IREF is activated in a state where the idle signal IDLE is deactivated, a refresh operation is not performed.

Figure 7:
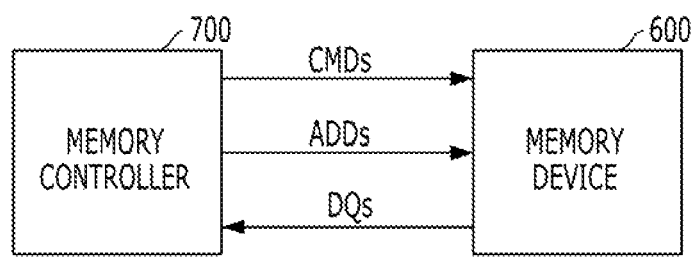
FIG. 7 is a block diagram of a memory system in accordance with another embodiment of the present invention.

FIG. 7 is a configuration diagram of a memory system in accordance with an embodiment of the present invention.

Referring to FIG. 7, the memory system includes a memory device 600 and a memory controller 700.

The memory controller 700 is configured to control overall operations of the memory device 600. The main role of the memory controller 700 is to control the memory device 600 to perform write and read operations. The memory controller 700 transmits write commands CMDs, addresses ADDs, and data DQs to the memory device 600 during a write operation, such that the data are stored at designated positions of the memory banks inside the memory device 600. At this time, the commands CMDs are transmitted as a combination of signals. Furthermore, the memory controller 700 transmits read commands CMDs and addresses ADDs to the memory device 600 during a read operation, such that data stored at designated positions of the memory banks inside the memory device 600 are called.

Furthermore, the memory controller 700 controls the memory device 600 to repair a defective cell inside the memory device 600, that is, to program a fail address into the programmable storage unit 650 inside the memory device 600. This operation will be described in detail with reference to FIG. 8.

Figure 8:
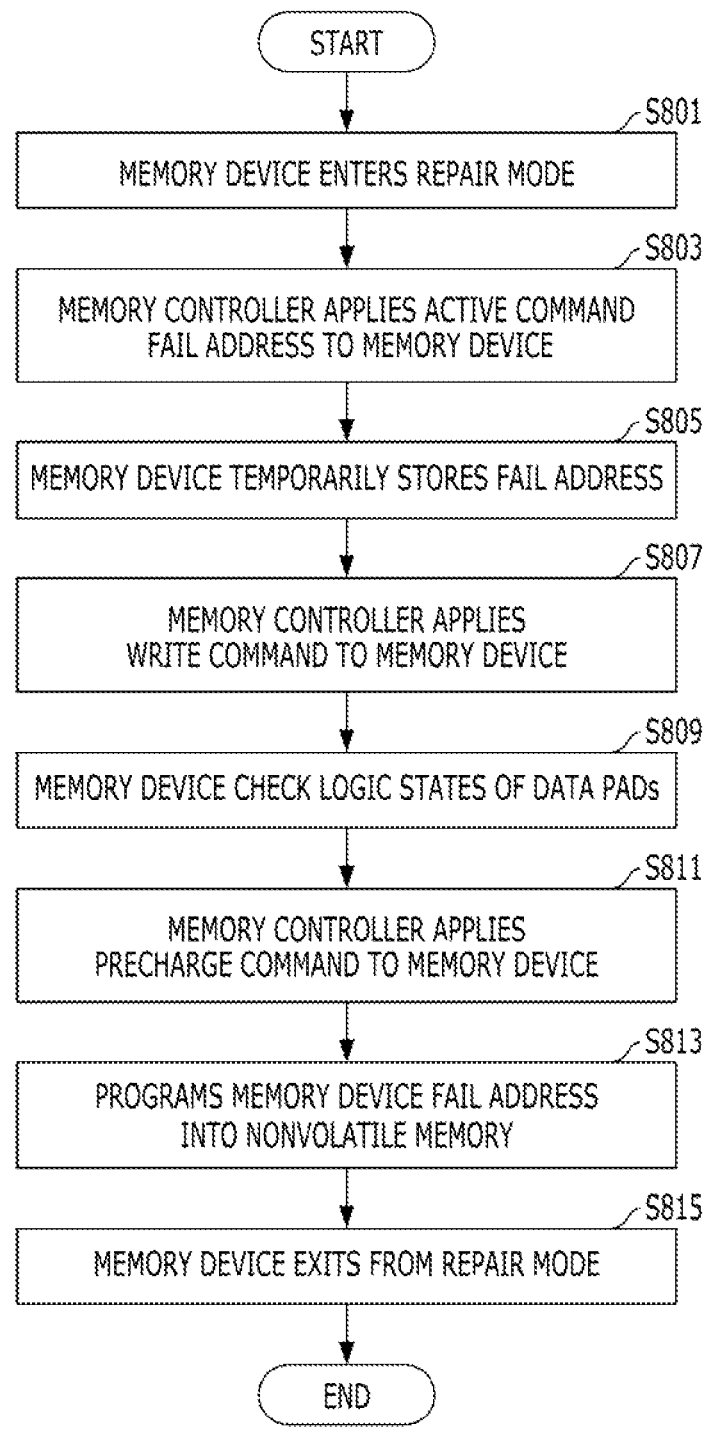
FIG. 8 is a flowchart illustrating a post package repair process of the memory system shown in FIG. 7.

FIG. 8 is a flowchart illustrating a post package repair process of the memory system of FIG. 7.

Referring to FIG. 8, the memory device 600 enters the repair mode at step S801. The entry of the memory device 600 into the repair mode may be performed through the following process: a mode setting command MRS and a combination of address bits ENT for the entry into the repair mode are applied to the memory device 600 from the memory controller 700 and the mode decoder 620 inside the memory device 600 activates the repair mode signal PPREN. At this time, the mode setting command MRS is applied as a combination of commands CMDs, and the address ENT is applied as a combination of addresses ADDs.

After the memory device 600 enters the repair mode, a fail address RA and an active command ACT are applied to the memory device 600 from the memory controller 700 at step S803. At this time, the fail address RA is applied as a combination of addresses ADDs, and the active command ACT is applied as a combination of commands CMDs. Then, the command decoder 610 inside the memory device 600 internally activates the internal active command IACT, and the temporary storage unit 630 temporarily stores the fail address RA in response to the internal active command IACT at step S805.

Then, a write command WR is applied to the memory device 600 from the memory device 700 at step S807. At this time, the write command WR is applied as a combination of commands CMDs. Then, the command decoder 610 inside the memory device 600 internally activates the internal write command IWR.

When a time corresponding to a write latency WL passes after the application of the write command WR, the control unit 640 of the memory device 600 checks logic states of data DQs inputted through the data input unit 603 at step S809. When the logic states of the data are '0', it means that the memory device 600 is a target. Thus, the control unit 640 determines to perform a program operation. Otherwise, the control unit 640 determines to not perform a program operation.

Then, a precharge command PRE is applied to the memory device 600 form the memory controller 700 at step S811. At this time, the precharge command PRE is applied as a combination of commands CMDs. The command decoder 610 inside the memory device 600 internally activates the internal precharge command IPRE, and the control unit 640 starts to program the address PGM_ADD, which is temporarily-stored in the temporary storage unit 630, into the programmable storage unit 650 in response to the activation of the internal precharge command IPRE, at step S813. When checking that the memory device 600 is a target, the control unit 640 may control the programmable storage unit 650 to start a program operation even before the precharge command PRE is applied, as described with reference to FIG. 5.

After the program operation is completed, the repair mode of the memory device 600 is ended at step S815. The repair mode exit of the memory device 600 may be performed through the following process: a mode setting command MRS and a combination of address bits EXIT for repair mode exit are applied to the memory device 600 from the memory controller 700 and the mode decoder 620 inside the memory device 600 deactivates the repair mode signal PPREN. At this time, the mode setting command MRS is applied as a combination of commands CMDs, and the address EXIT is applied as a combination of addresses ADDs.

After the precharge command PRE is applied to the memory device 600 from the memory controller 700, the refresh command REF may be applied to the memory device 600 from the memory controller 700 such that the memory device 600 may perform a refresh operation, even before the program operation of the programmable storage unit 650 is completed.

Although not illustrated in FIG. 8, a step of verifying whether or not the program operation is normally performed may be additionally performed, after the program operation is completed. When it is verified that the program operation is not normally performed, the program operation may be performed again.

In accordance with the embodiments of the present invention, it may be possible to repair a fail of a memory device through a simple sequence to apply a command and a fail address to the memory device. Furthermore, since a refresh operation may be performed even while repair is performed, data stored in the memory device may be retained.

Although various embodiments have been described for illustrative purposes, it will be apparent to those skilled in the art that various changes and modifications may be made without departing from the spirit and scope of the invention as defined in the following claims.

What is claimed is:

1. An operating method of a memory device, comprising:
   entering a repair mode;
   receiving an active command and a fail address, and temporarily storing the received command and address to a temporary storage unit;
   receiving a write command, and determining whether to perform a program operation;
   when the program operation is determined to be performed, programming the temporarily-stored fail address into a programmable storage unit; and
   receiving a precharge command before the programming of the temporarily-stored fail address is completed.

2. The operating method of claim 1, further comprising receiving a refresh command after the receiving of the precharge command.

3. The operating method of claim 1, further comprising checking a logic state of at least one data pad before the determining of whether to perform the program operation.

4. The operating method of claim 1, further comprising exiting from the repair mode after the programming of the temporarily-stored fail address is completed.

5. The operating method of claim 1, further comprising verifying whether the programming of the temporarily-stored fail address is properly performed, after the programming of the temporarily-stored fail address.

6. The operating method of claim 1, wherein the programming of the temporarily-stored fail address is started in response to the application of the precharge command.

7. The operating method of claim 1, wherein the programmable storage unit includes an E-fuse array circuit.

8. A memory device comprising:
   a command input unit suitable for receiving a plurality of commands;
   an address input unit suitable for receiving a plurality of address bits;
   a data input unit suitable for receiving a plurality of data;
   a command decoder suitable for decoding the plurality of commands and generating an internal active command, an internal mode setting command, an internal write command, an internal precharge command, an internal refresh command, and an internal read command;
   a mode decoder suitable for generating a repair mode signal by using the internal mode setting command and the address bits as a mode setting code;
   a temporary storage unit suitable for temporarily storing the address bits as a fail address, when the Internal active command and the repair mode signal are activated;
   a control unit suitable for determining whether to perform a program operation in response to activation of the internal write command and the repair mode signal; and
   a programmable storage unit suitable for being programmed with the temporarily-stored fail address, when the control unit determines to perform the program operation.

9. The memory device of claim 8, wherein the program operation is started when the internal precharge command is activated after the control unit determines to perform the program operation.

10. The memory device of claim 8, further comprising:
    a bank active circuit suitable for generating bank active signals corresponding to a plurality of memory banks, respectively, by using a bank information, the internal active command, and the internal precharge command;
    an idle signal generation unit suitable for generating an idle signal, which is activated when all of the bank active signals are deactivated; and
    a refresh circuit suitable for controlling a refresh operation in response to activation of the internal refresh command and the idle signal.

11. The memory device of claim 8, wherein the control unit is suitable for checking a value of the data before determining whether the program operation is to be performed or not.

12. The memory device of claim 11, wherein the control unit determines to perform the program operation when all of the data have a value of logic low level when a write latency (WL) lapses after the internal write command is activated.

13. The memory device of claim 8, wherein the programmable storage unit includes an E-fuse array circuit.

14. An operating method of a memory system, comprising:
    entering, by a memory device, a repair mode according to control of a memory controller;
    applying, by the memory controller, a fail address and an active command to the memory device;
    temporarily storing, by the memory device, the fail address;
    applying, by the memory controller, a write command to the memory device;
    determining, by the memory device, whether to perform a program operation, in response to the application of the write command;
    programming, by the memory device, the temporarily-stored fail address into a programmable storage unit inside the memory device, when the program operation is determined to be performed; and
    applying, by the memory controller, a precharge command to the memory device before the programming of the temporarily-stored fail address is completed.

15. The operating method of claim 14, further comprising checking, by the memory device, a logic state of at least one data pad in response to the application of the write command, before the determining of whether to performed the program operation.

16. The operating method of claim 14, wherein the programming of the temporarily-stored fail address is started in response to the application of the precharge command.

17. The operating method of claim 14, further comprising applying, by the memory controller, a refresh command to the memory device, after the applying of the precharge command.

18. The operating method of claim 14, further comprising exiting, by the memory device, from the repair mode according to control of the memory controller after the programming of the temporarily-stored fail address.

19. The operating method of claim 14, further comprising verifying, by the memory controller, whether the program operation is normally performed, after the programming of the temporarily-stored fail address is completed.

20. The operating method of claim 14, wherein the programmable storage unit includes an E-fuse array circuit.

* * * * *